US009006847B2

(12) United States Patent
Welter et al.

(10) Patent No.: US 9,006,847 B2
(45) Date of Patent: Apr. 14, 2015

(54) SENSOR MODULE FOR ACCOMMODATING A PRESSURE SENSOR CHIP AND FOR INSTALLATION INTO A SENSOR HOUSING

(75) Inventors: Aline Welter, Eisenach (DE); Alexander Lux, Ostfildern (DE); Christoph Gmelin, Stuttgart (DE); Jens Vollert, Muehlhausen (DE); Reinhold Herrmann, Stuttgart (DE); Eckart Schellkes, Kirchentellinsfurt (DE)

(73) Assignee: Robert Bosch GmbH, Stuttgart (DE)

( * ) Notice: Subject to any disclaimer, the term of this patent is extended or adjusted under 35 U.S.C. 154(b) by 81 days.

(21) Appl. No.: 13/817,698

(22) PCT Filed: Jul. 20, 2011

(86) PCT No.: PCT/EP2011/062423
§ 371 (c)(1),
(2), (4) Date: May 8, 2013

(87) PCT Pub. No.: WO2012/022572
PCT Pub. Date: Feb. 23, 2012

(65) Prior Publication Data
US 2013/0221458 A1 Aug. 29, 2013

(30) Foreign Application Priority Data
Aug. 20, 2010 (DE) .......................... 10 2010 039 599

(51) Int. Cl.
H01L 29/84 (2006.01)
G01L 19/06 (2006.01)
G01L 19/00 (2006.01)

(52) U.S. Cl.
CPC ............ *H01L 29/84* (2013.01); *G01L 19/0627* (2013.01); *G01L 19/0084* (2013.01); *H01L 2224/48091* (2013.01); *H01L 2224/48137* (2013.01); *H01L 2224/49171* (2013.01); CPC ......... *H01L2924/19107* (2013.01); *H01L 2924/10253* (2013.01)

(58) Field of Classification Search
USPC .......................................................... 257/417
See application file for complete search history.

(56) References Cited

U.S. PATENT DOCUMENTS 7,024,947 B2 * 4/2006 Ishiguro et al. .......... 73/862.451
2008/0006939 A1 * 1/2008 Logan et al. .................. 257/734
(Continued)

FOREIGN PATENT DOCUMENTS

CN 1241257 1/2000
CN 101373158 2/2009
(Continued)

OTHER PUBLICATIONS

International Search Report for PCT/EP2011/062423, dated Oct. 28, 2011.

Primary Examiner — Thao P Le
(74) Attorney, Agent, or Firm — Kenyon & Kenyon LLP

(57) ABSTRACT

In a sensor module for accommodating a pressure sensor chip and for installation into a sensor housing, a module wall is connected monolithically to the module bottom and surrounds the pressure sensor chip. Multiple connecting elements which are conducted through the module wall to the outside run straight at least in the entire outside area. Furthermore, the connecting elements are exposed on their top and bottom sides for affixing and electrically connecting at least one electrical component and for electrically integrating the sensor module into the sensor housing. In this way, a two-sided use of a sensor module having an identical external geometry and identical connectors is possible.

10 Claims, 8 Drawing Sheets

(56) References Cited

U.S. PATENT DOCUMENTS

| | | |
|---|---|---|
| 2008/0034877 A1 | 2/2008 | Fessele et al. |
| 2011/0230068 A1* | 9/2011 | Pahl ............................ 439/65 |

FOREIGN PATENT DOCUMENTS

| | | |
|---|---|---|
| CN | 101498612 | 8/2009 |
| DE | 10 2004 012 593 | 9/2005 |
| EP | 1 096 241 | 5/2001 |
| JP | 59-15944 | 1/1984 |
| JP | 61-222273 | 10/1986 |
| JP | 4-313036 | 11/1992 |
| JP | 6-140738 | 5/1994 |
| JP | 7-245377 | 9/1995 |
| JP | 2003-149068 | 5/2003 |
| JP | 2003-315188 | 11/2003 |
| JP | 2004-165525 | 6/2004 |
| JP | 2005-341326 | 12/2005 |
| JP | 2007-19154 | 1/2007 |
| JP | 2011-510276 | 3/2011 |

* cited by examiner

SENSOR MODULE FOR ACCOMMODATING A PRESSURE SENSOR CHIP AND FOR INSTALLATION INTO A SENSOR HOUSING

BACKGROUND OF THE INVENTION 1.1 Field of the Invention

The present invention is directed to a sensor module for accommodating a pressure sensor chip and for installation into a sensor housing.

2.1 Description of the Related Art

A sensor module is already known from published German patent application document DE 10 2004 012 593 A1 which is installable into a sensor housing. The sensor housing has two interior spaces separated from one another and is provided with electric conductors embedded therein. One of the interior spaces is provided with at least one capacitor, the sensor module being situated in the other interior space. A silicon chip on which pressure-sensitive elements are situated and which is used as a semiconductor pressure sensor is installed in the sensor module. The sensor module is a box-shaped bowl which is open on top and which is formed from a bottom and a wall surrounding the sensor chip. The sensor module is made of plastic, for example, and has connecting elements which are conducted starting from the inside through the surrounding wall to the outside and into the interior space of the sensor housing, where they are connected to the embedded electric conductors by soldering or pressure contacting. The connecting elements are covered by an adhesive after being connected. The sensor module is filled with gel to protect the sensor chip and the sensor chip is thus embedded therein.

BRIEF SUMMARY OF THE INVENTION

The sensor module according to the present invention for accommodating a pressure sensor chip and for installation into a sensor housing has a module bottom, the module bottom having a chip installation area on which the pressure sensor chip is installable. Furthermore, the sensor module has a module wall which is connected monolithically to the module bottom and which surrounds the chip installation area. Multiple connecting elements which are conducted to the outside are conducted through the module wall. The connecting elements run straight at least in the entire outside area. In this case, the connecting elements are exposed at least partially on both sides, which point in opposite directions along a normal relative to the module bottom, for applying and electrically connecting at least one electrical component and for electrically integrating the sensor module into the sensor housing. The at least one electrical component is preferably an at least one capacitor; alternatively or additionally, one or multiple resistors, diodes, or other electrical components could, however, also be provided which have two connectors and are available as SMD electronic components. This sensor module has the advantage over the related art that it is installable and electrically connectable in both orientations, i.e., with the open side (gel side) up or down. In this way, a high degree of flexibility is achieved which allows an entire range of different sensor applications to be implemented using sensor modules which have the same geometry and connectors and thus using a single casting mold required therefor. Thus, the sensors are implementable for various applications according to a modular design principle. Due to the fact that only one casting mold is necessary for multiple applications (only one premold die), it is possible to reduce the manufacturing costs. Since integration with the open side (gel side) down is possible, a higher medium resistance may furthermore be achieved since fluid accumulations on the gel may be discharged or drip off unimpeded. Due to the reduced risk of fluid accumulations, the risk of icing may furthermore be reduced.

According to the exemplary embodiment, the sensor module is furthermore provided with an opening which extends through the module bottom and ends in the chip installation area of the sensor module. Thus, the sensor module may, for example, be installed with the gel side up and a pressure applied to the module bottom may be measured. Moreover, this measure offers the possibility of a differential pressure measurement between a pressure applied to the gel side and to the module bottom. It is thus made possible for the pressure supply and the electrical connection each to be positioned on different sides of the sensor module, whereby an increased medium robustness and a greater flexibility are achieved with regard to the variant diversity.

According to another exemplary embodiment, a sensor module is made available in which the module bottom and the module wall are cast monolithically and casting material is also present in the outside area between the connecting elements. This has the advantage that the connecting elements are better fixed and held in place. This may prevent the connecting elements from bending when they are inserted into the sensor housing, thus achieving a reliable contact. Moreover, the connecting elements are better insulated against one another and a more compact sensor module is made available.

Advantageously, casting material is present in the outside area between the connecting elements, covering at least 80% of the connecting elements' length in the outside area. This results in another improvement of the advantages named in the previous paragraph.

According to another exemplary embodiment, casting material is present in the outside area between the connecting elements, covering the entire length of the connecting elements in the outside area.

According to another exemplary embodiment, a sensor module is made available in which the connecting elements are surrounded by casting material in the outside area and only the end areas of the connecting elements pointing toward the outside area are exposed on both sides, which point in opposite directions along a normal relative to the module bottom, as well as an area recessed for applying the at least one electrical component, preferably at least one capacitor. In this way, the connecting elements are largely embedded and protected. This results in the connecting elements being reliably fixed and insulated from one another. Furthermore, the sheathing of the connecting elements may be used as a model so that the shape of the sheathing is adapted to a shape of the inner surfaces of the sensor housing in such a way that the contact areas of the particular connecting elements are conducted toward the corresponding contact areas provided on the side of the sensor housing when the connecting elements are inserted into the housing.

According to another exemplary embodiment, a sensor module is made available, the periphery of the sensor module initially increasing and then tapering starting from the side of the module bottom pointing outward in a direction which is normal relative to the module bottom. Thus, the sensor module may be inserted into a corresponding recess on the side of the sensor housing in an improved manner and therefore has an improved fit in this regard.

According to another exemplary embodiment, a system having such a sensor module and at least two sensor housings is made available, the at least two sensor housings having an indentation on their inner surfaces, the side of the module bottom pointing outward being geometrically adapted to the indentation of the one sensor housing, and the area of the module wall pointing in the opposite direction being geometrically adapted to the indentation of the other sensor housing. In this way, a two-sided use of the sensor module may be implemented in which an erroneous insertion is additionally prevented. By adapting the gel side of the sensor module to a sensor housing and by adapting the bottom side of the sensor module to a different sensor housing, each side is thus unambiguously assigned to the appropriate sensor housing in the event of a two-sided use option.

According to another exemplary embodiment, a system is created in which the side walls of the sensor module have a first tilt on the one side, with regard to a plane in which the connecting elements are situated, and a second tilt on the other side, with regard to a normal relative to the module bottom, and the side walls of the indentation of the one sensor housing have the first tilt and the side walls of the indentation of the other sensor housing have the second tilt. This improves the described assignment to different sensor housings even more.

Exemplary embodiments of the present invention are illustrated in the drawings and explained in greater detail in the description that follows.

DETAILED DESCRIPTION OF THE INVENTION

Figure 1A:
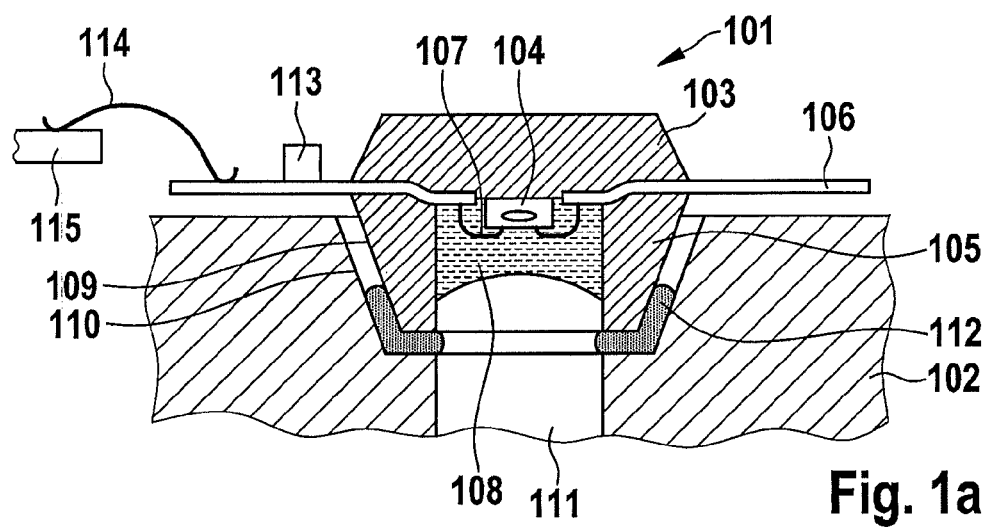
FIG. 1a shows a first exemplary embodiment of the sensor module in an intake manifold pressure sensor housing.

In the following description of the figures, identical reference numerals denote identical components. Thus, the description of one element in conjunction with one figure also applies to the other figures if it has the same reference numeral and/or is illustrated in the same manner.

The FIGS. 1a through 1d show sectional illustrations through the center of the subsequently explained opening in the bottom of the sensor module and parallel to the longitudinal direction of the connecting elements. FIG. 1a shows a first exemplary embodiment of sensor module 101 in an intake manifold pressure sensor housing 102. This is a pressure sensor which measures a manifold absolute pressure in internal combustion engines. Sensor module 101 is a box-shaped bowl having a square module bottom 103. On the side of module bottom 103 facing inside, a pressure sensor chip 104 is fastened on a chip installation area provided therefor with the aid of a silicone adhesive, for example. Pressure sensor chip 104 is preferably a porous silicon chip. A module wall 105 which is connected monolithically to module bottom 103 and surrounds pressure sensor chip 104 extends from the module bottom. Thus, sensor module 101 is designed as a bowl which is open on one side and has a square base area. Side surfaces 109 of sensor module 101 are designed to have a tilt with regard to a normal relative to module bottom 103 (i.e., the vertical in FIG. 1a) in such a way that the periphery of sensor module 101 initially increases and then decreases within a plane parallel to module bottom 103 starting from module bottom 103. In the area of the greatest periphery, connecting elements 106 are provided which extend from the hollow interior space of sensor module 101 through module wall 105 to the outside. In the entire outside area, i.e., outside of module wall 105, connecting elements 106 run straight (without bending and without kinks) preferably in parallel to module bottom 103. The connecting elements are made of electrically conductive material, e.g., copper. The inside ends of connecting elements 106 lead to the inner hollow space of sensor module 101 and are exposed in the area of the interior space bottom. Pressure sensor chip 104 is connected to connecting elements 106 with the aid of bonding wires 107 either directly or via an ASIC chip (not illustrated). After establishing this connection, the interior space of sensor module 101 is filled at least partially with gel 108 so that bonding wires 107 and pressure sensor chip 104 are embedded in gel. Sensor housing 102 is provided with an indentation 110, which is adapted to the shape of sensor module 101, in the area of the side facing away from module bottom 103. In particular, indentation 110 has a depth which corresponds to the distance between connecting elements 106 and the side facing away from module bottom 103 (along the normal). The tilt of the side flanks of indentation 110 corresponds to that of side surfaces 109 of sensor module 101 located in indentation 110 (when inserted). The bottom area of indentation 110 corresponds approximately to the side facing away from module bottom 103 with regard to surface area and shape. A measuring channel 111 in which the pressure to be measured prevails ends in the center of the bottom of indentation 110. Sensor module 101 is inserted into the indentation with the open side facing the indentation (the bottom of the indentation). The cross section of the measuring channel (i.e., perpendicularly to its longitudinal direction) corresponds approximately to the cross section of the open interior space of sensor module 101 so that the interior space of sensor module 101 and measuring channel 111 are flush when sensor module 101 is inserted. The area of sensor module 101 which is in contact with the inside of indentation 110 forms an adhesive surface which is glued into the indentation using an adhesive 112, preferably a silicone adhesive. On the side of connecting elements 106 facing away from the adhesive surface, capacitors 113 are affixed as the preferred electrical components, one terminal of capacitor 113 being electrically connected to a connecting element and the other terminal of the same capacitor 113 being electrically connected to an adjacent connecting element 106. With the aid of bonding wires 114, connecting elements 106 are electrically connected to electrical contacts 115 on the side of the sensor housing and are thus electrically integrated into sensor housing 102. These electrical contacts 115 on the side of the housing are conducted further in sensor housing 102 to other electronic elements or elements which are outside of the sensor housing.

Figure 1B:
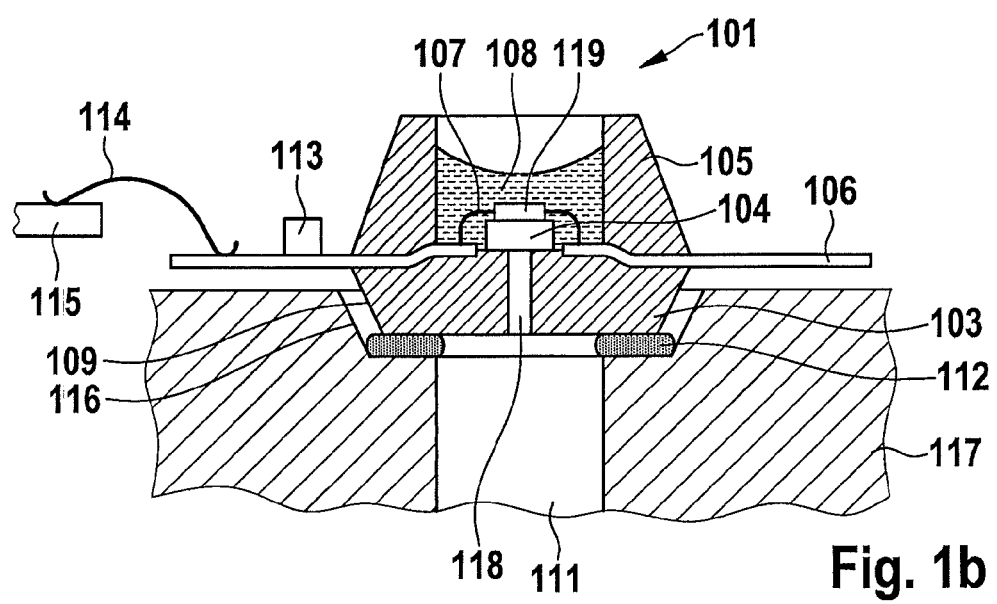
FIG. 1b shows the first exemplary embodiment of the sensor module in an absolute pressure sensor housing having a cap chip.

FIG. 1b shows the first exemplary embodiment of sensor module 101 in an absolute pressure sensor housing having a cap chip (sensor element having a reference vacuum under a cap and operative pressure from below). In contrast to FIG. 1a, sensor module 101 in FIG. 1b is inserted into the indentation in a reverse orientation, i.e., with its open side pointing away from an indentation 116 of a sensor housing 117. Sensor housing 117 differs from sensor housing 102 in that the indentation is adapted to the shape of sensor module 101 in the area of module bottom 103. Indentation 116 has a depth which corresponds to the distance (along the normal relative to module bottom) between connecting elements 106 and the outside of module bottom 103. The side flanks of indentation 116 have the same tilt as the side surfaces of sensor module 101 located in the indentation. In this application, the outside of module bottom 103 is used as the adhesive surface and is fixed in indentation 116 using adhesive 112. In contrast to sensor module 101 from FIG. 1a, sensor module 101 from FIG. 1b has an opening 118 which ends in the sensor chip installation area in the interior space of sensor module 101. Sensor modules 101 from FIGS. 1a and 1b correspond with regard to their geometry so that the same casting mold may be used for both. The sensor module is manufactured from plastic. In the embodiment from FIG. 1b, the only difference is that a pin is provided as an insert during the casting process to create opening 118. Alternatively, opening 118 could always be provided and closed off using a pin or an adhesive in the case of the application from FIG. 1a. In FIG. 1b, a cap 119 is affixed on pressure sensor chip 104 (i.e., on the side of the chip facing away from opening 118) having a reference vacuum. Thus, a pressure prevailing in the measuring channel may be applied to pressure sensor chip 104 and measured via opening 118. The advantage of this measurement via opening 118 is that the fluid to be measured may be completely separated from the electronics system in the interior space of sensor housing 117 and from electrical contacts 106, 114, 115 located therein. Capacitors 113 are also affixed on the side of connecting elements 106 facing away from the adhesive surface and are electrically connected to them.

Figure 1C:
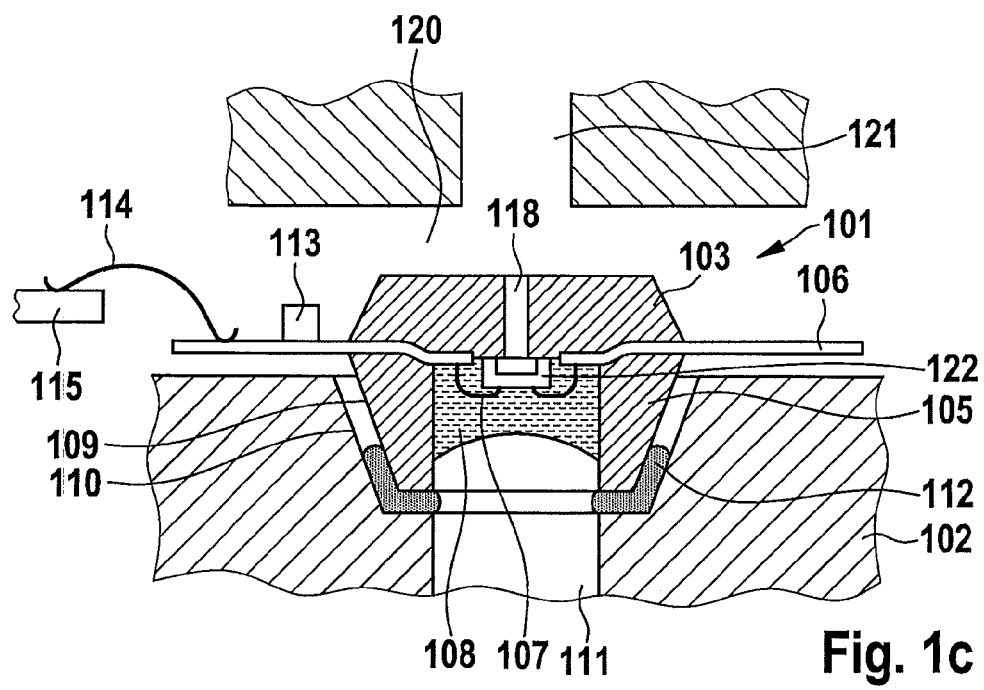
FIG. 1c shows the first exemplary embodiment of the sensor module in a brake booster sensor housing.

FIG. 1c shows the first exemplary embodiment of the sensor module in a brake booster sensor housing. The orientation corresponds to the one described in FIG. 1a. In contrast to FIG. 1a, opening 118 described in FIG. 1b is provided in sensor module 101 in FIG. 1c. The pressure prevailing in measuring channel 111 is thus applied to the open side of sensor module 101, while atmospheric pressure is applied to opening 118, so that a differential pressure between these pressures may be detected. The atmospheric pressure may be conducted via a housing opening 121 of sensor housing 102 to an interior space 120 of sensor housing 102 surrounding module bottom 103. For the pressure difference measurement, a corresponding pressure sensor chip 122 is provided for the differential pressure measurement.

Figure 1D:
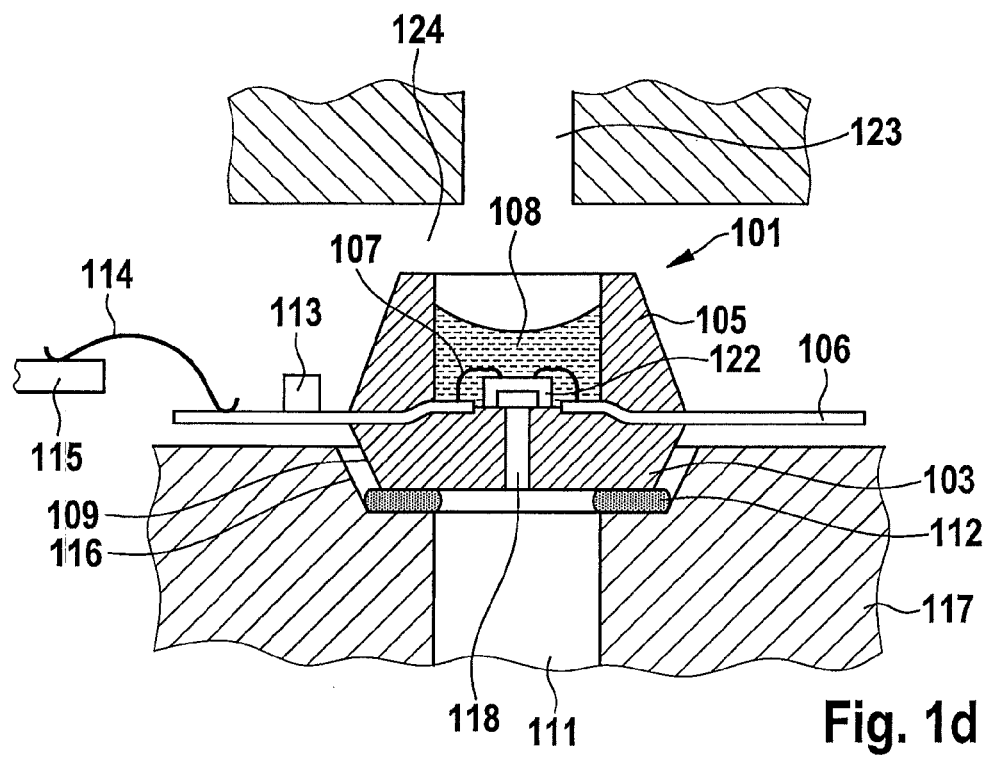
FIG. 1d shows the first exemplary embodiment of the sensor module in a tank pressure sensor housing.

FIG. 1d shows the first exemplary embodiment of the sensor module in a tank pressure sensor housing. The orientation corresponds to the one described in FIG. 1b. The pressure prevailing in measuring channel 111 is applied to opening 118 of sensor module 101, while atmospheric pressure is applied to the open side of sensor module 101, so that a tank pressure (differential pressure) between these pressures may be detected. The atmospheric pressure may be conducted via a housing opening 123 of sensor housing 117 to an interior space 124 of sensor housing 117 surrounding the gel side of the sensor module. For the pressure difference measurement, a corresponding pressure sensor chip 122 is provided for the differential pressure measurement. Due to the measurement via opening 118, the fuel vapor to be measured may be completely separated from the electronics system in the interior space of the sensor housing and from electrical contacts 106, 114, 115 located therein. Moreover, it is advantageous when the very aggressive fuel vapors do not get in contact with gel 108.

Figure 2:
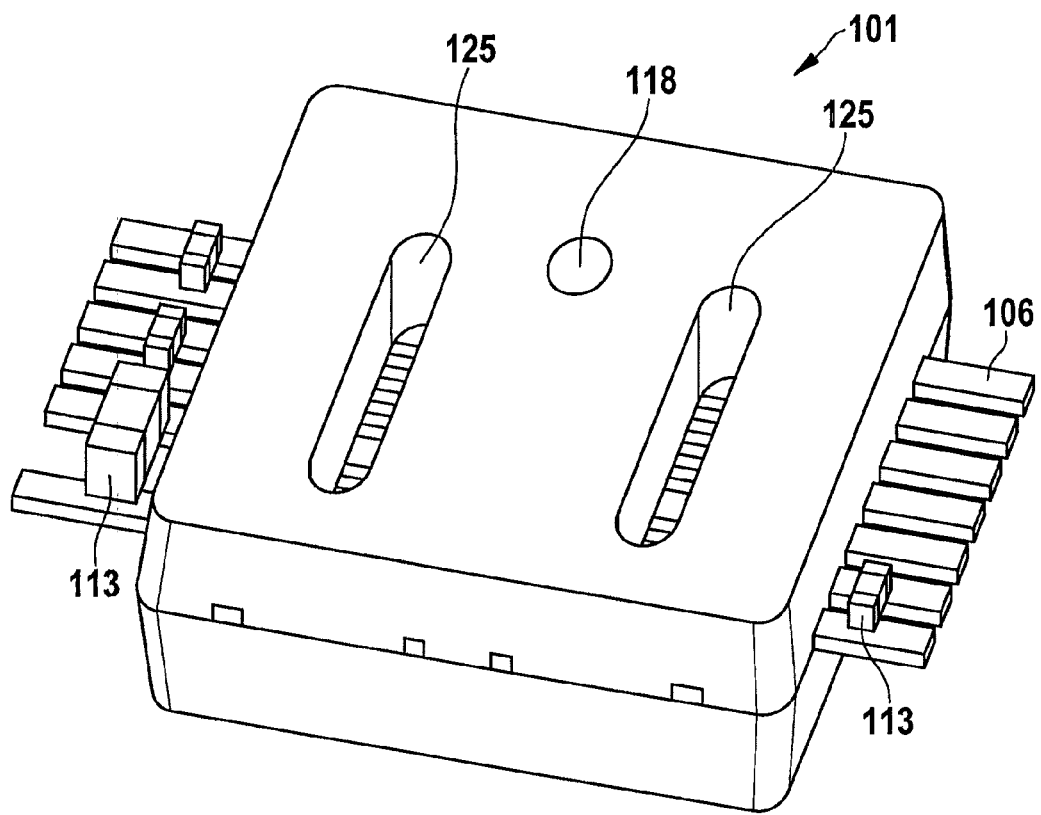
FIG. 2 shows a three-dimensional illustration of the sensor module according to the first exemplary embodiment of the present invention.

FIG. 2 shows a three-dimensional illustration of sensor module 101 according to the first exemplary embodiment of the present invention. In this illustration, capacitors 113 affixed on connecting elements 106 are well recognizable. Two slits 125, which are due to the manufacturing, are located in module bottom 103. Slits 125 are used to receive the casting compound to hold in place and protect a conductor comb lying underneath.

Figure 3:
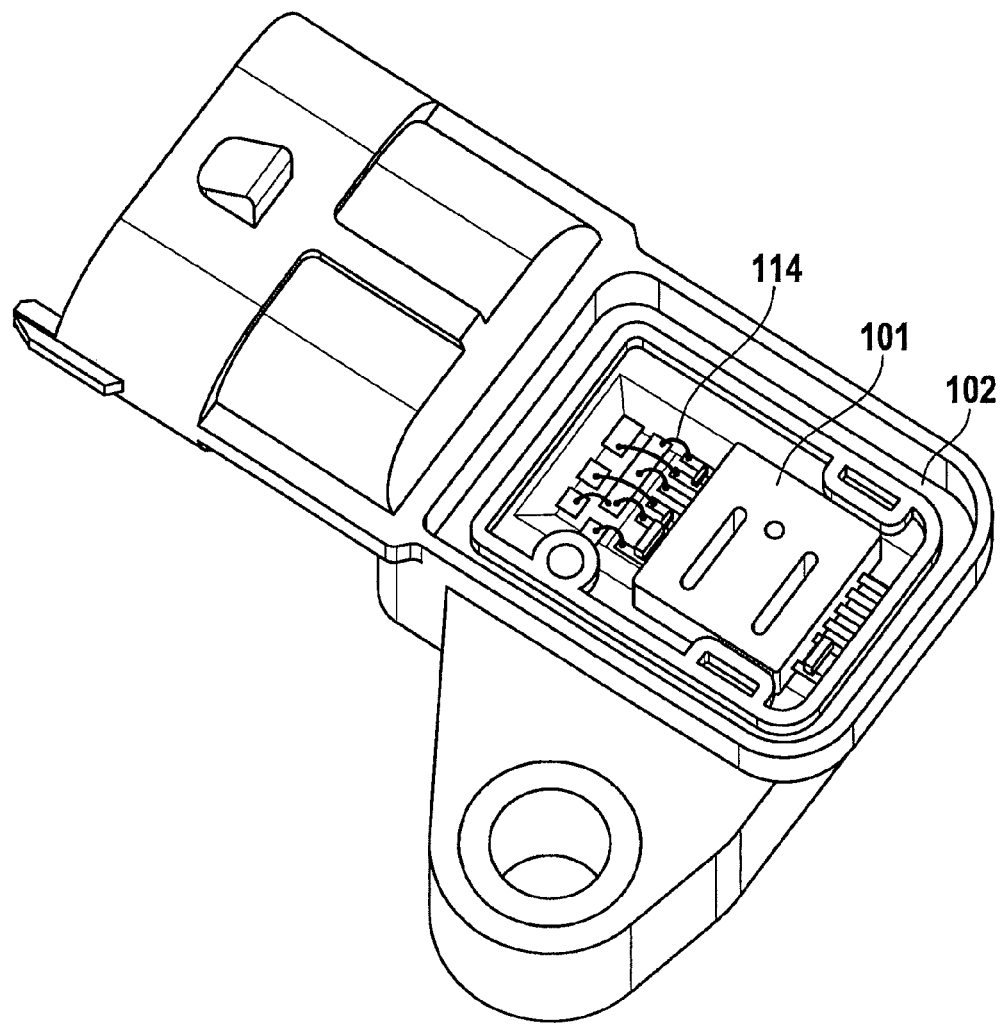
FIG. 3 shows a three-dimensional illustration of a sensor housing including the built-in sensor module according to the first exemplary embodiment of the present invention.

FIG. 3 shows a three-dimensional illustration of sensor housing 102 including built-in sensor module 101 according to the first exemplary embodiment of the present invention. In FIG. 3, the installation position of sensor module 102 is illustrated in which the open side of sensor module 101 points toward indentation 110 of sensor housing 102. Connecting elements 106 are connected to the electrical contacts on the housing side via described bonding wires 114.

Figure 4:
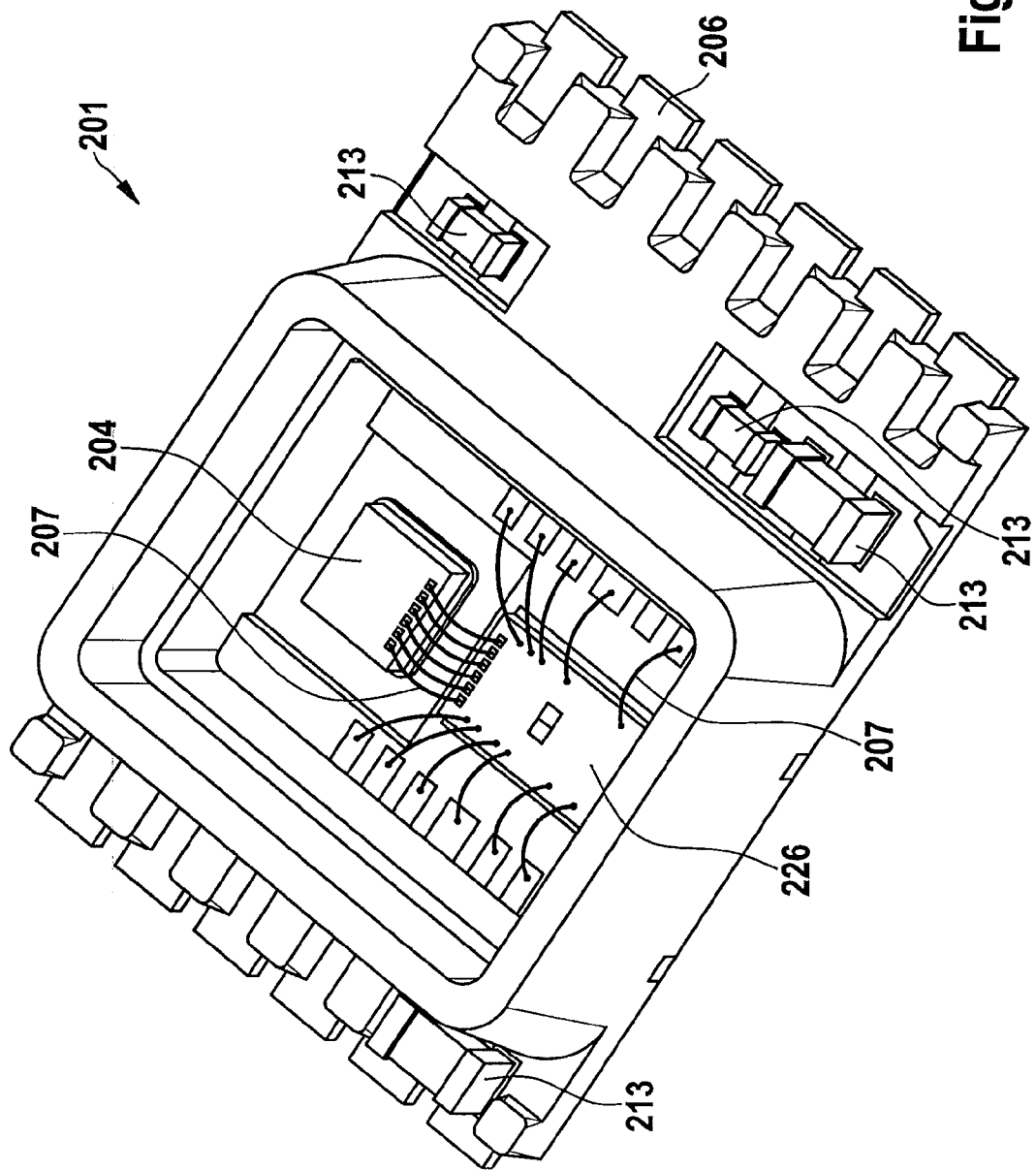
FIG. 4 shows a three-dimensional illustration of a sensor module according to a second exemplary embodiment of the present invention.

FIG. 4 shows a three-dimensional illustration of a sensor module 201 according to a second exemplary embodiment of the present invention. The above description of sensor module 101 applies to sensor module 201 and only the differences are described. In this exemplary embodiment, a pressure sensor chip 204 is situated above opening 118 (masked in FIG. 4); this pressure sensor chip corresponds to above-described pressure sensor chip 104 or 122 and is connected with the aid of bonding wires 207 to an ASIC (ASIC=application-specific integrated circuit) chip 226. ASIC chip 226 is, in turn, connected via bonding wires 207 to connecting elements 206, which correspond to above-described connecting elements 106. Capacitors 213 are placed on top of connecting elements 206, as described in conjunction with capacitors 113. The second exemplary embodiment differs essentially from the first exemplary embodiment of the present invention in that connecting elements 206 are largely extrusion-coated with the same casting material as the module bottom and the module wall, i.e., are connected monolithically to the module bottom and the module wall. In more precise terms, this means that there is casting compound between connecting elements 206 and only an end area of connecting elements 206, which is directed outward, is not surrounded by casting material over a length of 0.5 mm to 2 mm (in the longitudinal direction of connecting elements 206). Casting material is provided between connecting elements 206 covering an area of a length of 0.5 mm to 2 mm, which adjoins it and lies farther inside, but the top and the bottom sides are exposed. In this area, the casting material present between connecting elements 206 has the same height as in the subsequent area in which the connecting elements are completely surrounded. The top and the bottom sides correspond here to the sides pointing in opposite directions along a normal relative to the module bottom. The remaining area of connecting elements 206 is completely enveloped by casting material except for the sections where capacitors 213 are provided. These areas are recessed for the installation of capacitors 213 and connecting elements 206 are exposed in this area.

Figure 5:
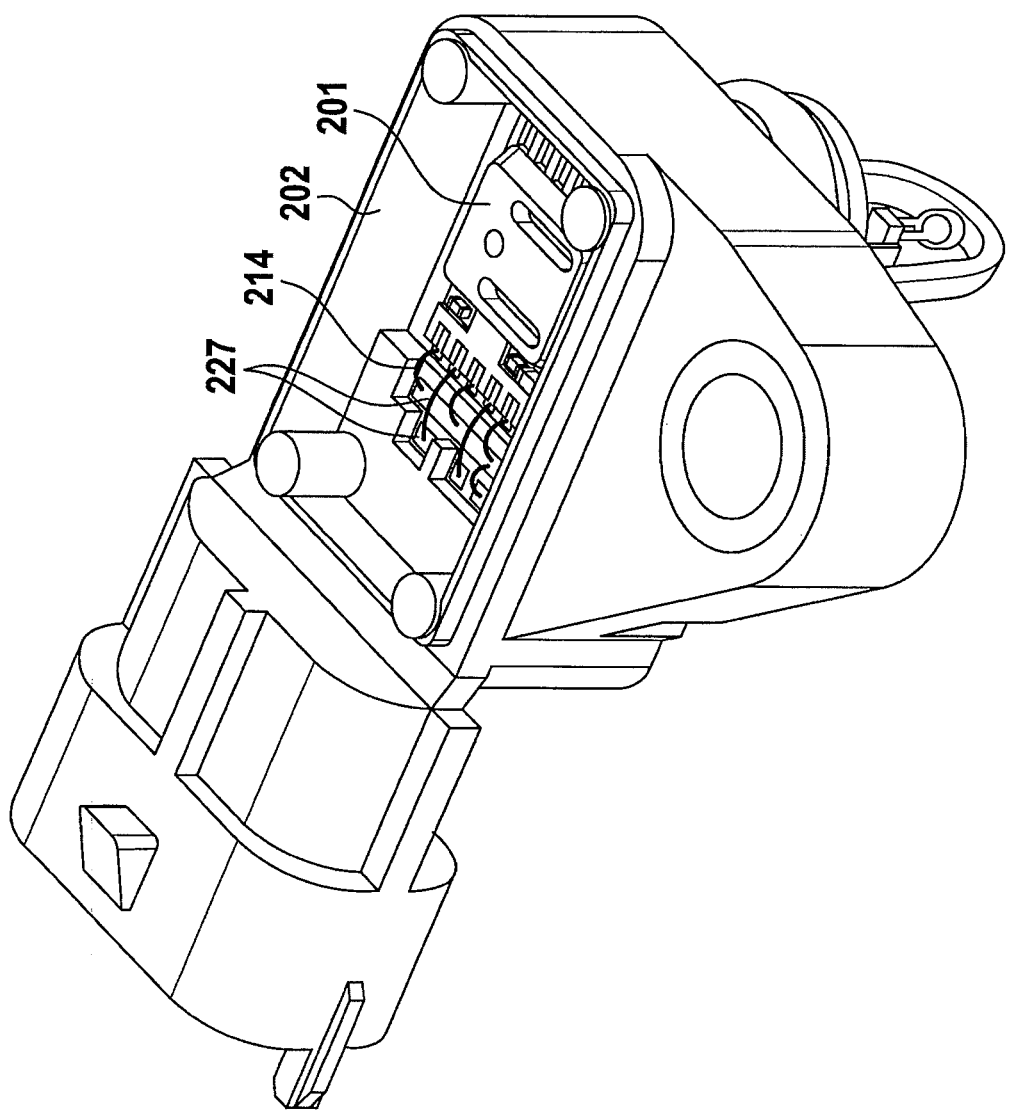
FIG. 5 shows a three-dimensional illustration of a sensor housing including the built-in sensor module according to the second exemplary embodiment of the present invention.

FIG. 5 shows a three-dimensional illustration of a sensor housing 202 including built-in sensor module 201 according to the second exemplary embodiment of the present invention. The description of sensor housing 102 applies to sensor housing 202. FIG. 5 shows sensor module 201 in the installation position in which the open side of sensor module 201 points toward the indentation of sensor housing 202. Connecting elements 206 are connected to electrical contacts 227 on the housing side via described bonding wires 214.

Figure 6:
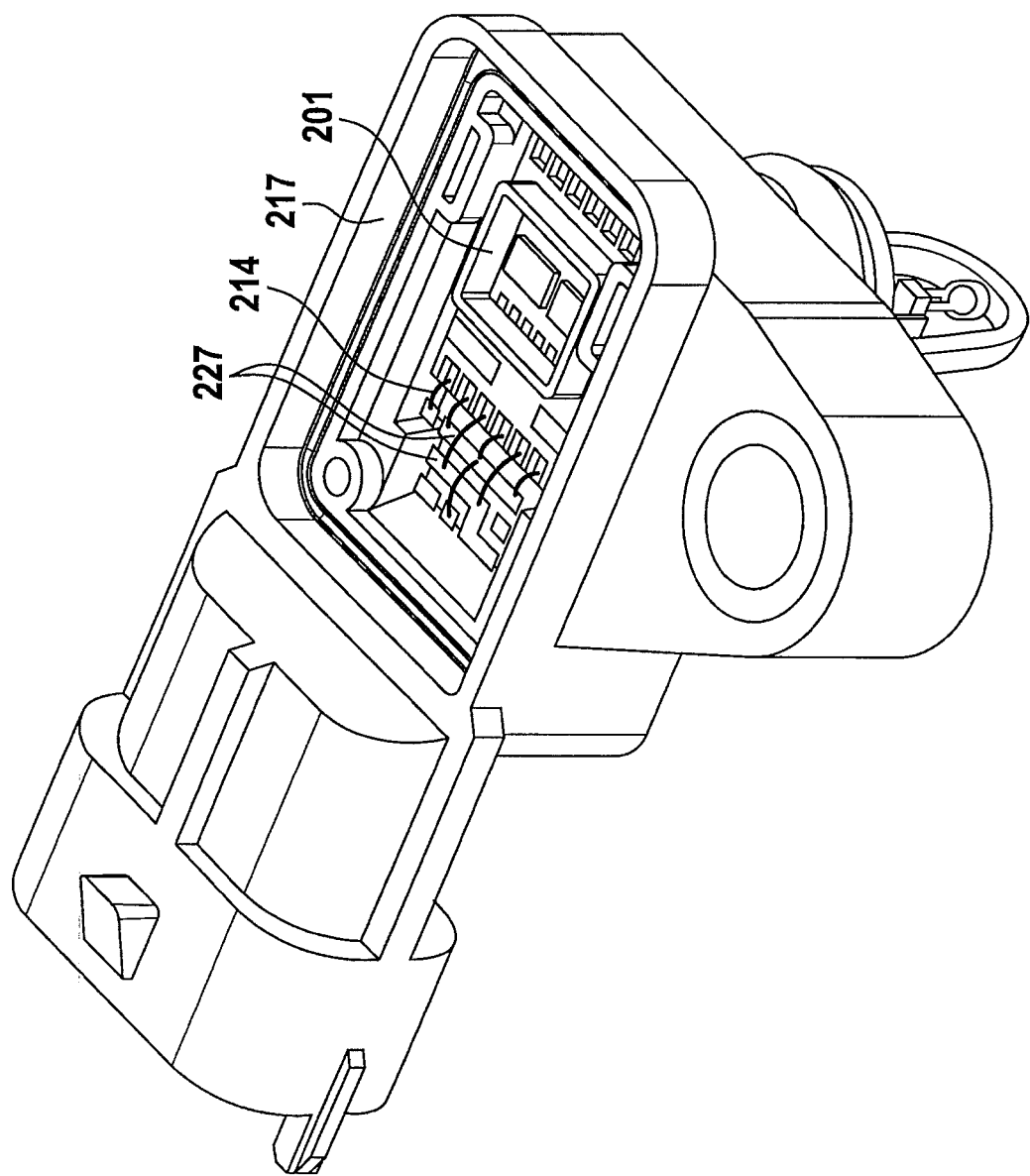
FIG. 6 shows a three-dimensional illustration of a sensor housing including the built-in sensor module according to the second exemplary embodiment of the present invention.

FIG. 6 shows a three-dimensional illustration of a sensor housing 217 including built-in sensor module 201 according to the second exemplary embodiment of the present invention. The description of sensor housing 117 applies to sensor housing 217. FIG. 6 shows sensor module 201 in the installation position in which the open side of sensor module 201 points away from the indentation of sensor housing 217. Connecting elements 206 are connected to electrical contacts 227 on the housing side via described bonding wires 214.

Figure 7:
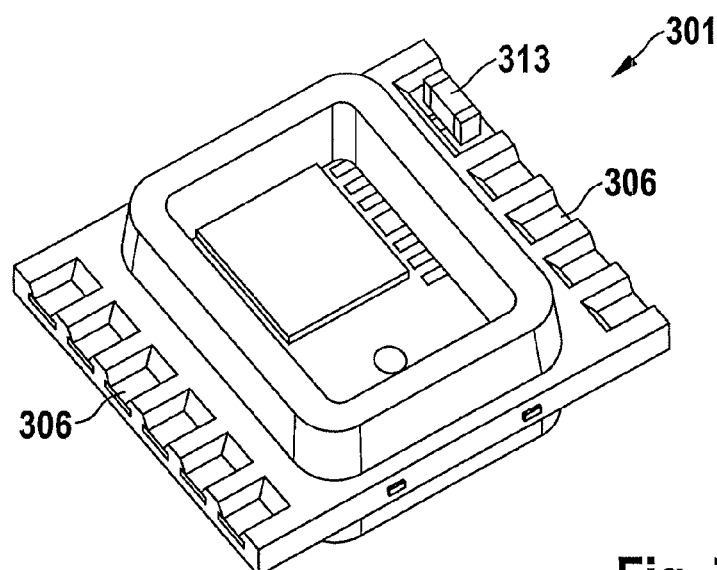
FIG. 7 shows a three-dimensional illustration of a sensor module according to a third exemplary embodiment of the present invention.

FIG. 7 shows a three-dimensional illustration of a sensor module 301 according to a third exemplary embodiment of the present invention. This third exemplary embodiment differs from the second exemplary embodiment illustrated in FIG. 4 in that casting material covers the entire length of the outside area between connecting elements 306 which correspond to connecting elements 106. Thus, an exposed area surrounding connecting elements 306 does not exist. In an end area of connecting elements 306, which is directed to the outside and which extends over a length of 0.5 mm to 2 mm, casting material is provided between connecting elements 306, but the top and the bottom sides are exposed. In this area, the casting material present between connecting elements 306 has the same height as in the subsequent area in which the connecting elements are completely surrounded by casting material. The remaining area of connecting elements 306 is completely enveloped by casting material. For the installation of capacitors 313, casting compound is provided between connecting elements 306 in the above-mentioned external end area of connecting elements 306, but it is only as high as connecting elements 306.

Figures 8A, 8B:
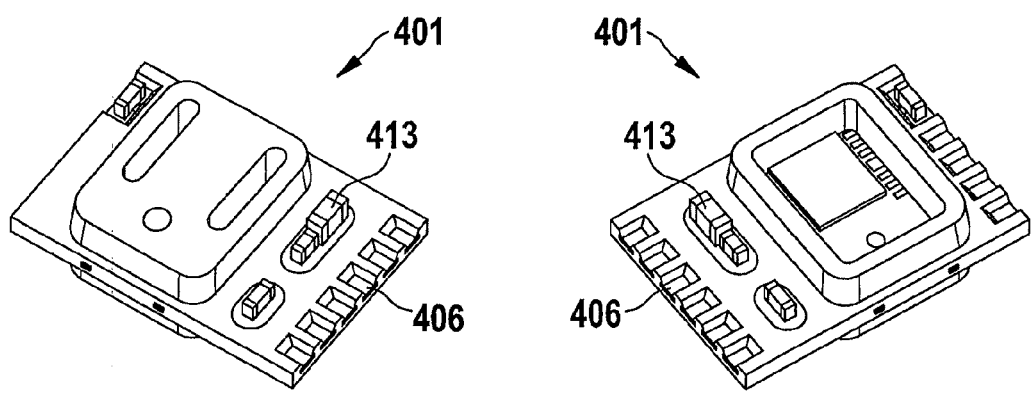
FIG. 8a shows a three-dimensionally illustrated bottom side of a sensor module according to a fourth exemplary embodiment of the present invention.
FIG. 8b shows a three-dimensionally illustrated top side of the sensor module according to the fourth exemplary embodiment of the present invention.

FIG. 8a shows a three-dimensionally illustrated bottom side of a sensor module 401 according to a fourth exemplary embodiment of the present invention, and FIG. 8b shows a three-dimensionally illustrated top side of the sensor module according to the fourth exemplary embodiment of the present invention. This exemplary embodiment differs from the third exemplary embodiment only in the way capacitors 413 are affixed, which are affixed as in the second exemplary embodiment. This means that they are not affixed in the external end area of connecting elements 406, but, in the area where connecting elements 406 are completely enveloped by casting material, sections are recessed where capacitors 413 are affixed and electrically connected to connecting elements 406 exposed in these sections.

The plural form was always used for the capacitors described in the exemplary embodiments above; it is, however, also possible that only a single capacitor is used per sensor module. Alternatively or additionally, one or multiple components of the group including resistors, diodes, or other electrical components, which have two connectors and are available as SMD electronic components, may also be affixed on the connecting elements.

Furthermore, it is pointed out that features which were described with reference to one of the above refinements may also be used in combination with other features of other refinements described above. Reference numerals in the claims are not to be considered as limitations.

What is claimed is:

1. A sensor module for accommodating a pressure sensor chip and for installation into a sensor housing, comprising:
a module bottom having a chip installation area on which the pressure sensor chip is installable;
a module wall connected monolithically to the module bottom and surrounding the chip installation area;
multiple connecting elements conducted through the module wall to the outside area, wherein the connecting elements extend straight at least in the entire outside area and the connecting elements are exposed at least partially on both sides, which point in opposite directions along a normal relative to the module bottom, for applying and electrically connecting at least one electrical component and for electrically integrating the sensor module into the sensor housing.

2. The sensor module as recited in claim 1, wherein an opening extends through the module bottom and ends in the chip installation area of the sensor module.

3. The sensor module as recited in claim 2, wherein the module bottom and the module wall are cast monolithically and a casting material is also present in the outside area between the connecting elements.

4. The sensor module as recited in claim 3, wherein the casting material is present in the outside area between the connecting elements, covering at least 80% of the connecting elements' length in the outside area.

5. The sensor module as recited in claim 3, wherein the casting material is present in the outside area between the connecting elements, covering the entire length of the connecting elements in the outside area.

6. The sensor module as recited in claim 4, wherein the connecting elements are surrounded by the casting material in the outside area and only the end areas of the connecting elements pointing outward are exposed on both sides, which point in opposite directions along a normal relative to the module bottom, as well as an area recessed for applying the at least one electrical component.

7. The sensor module as recited in claim 1, wherein the periphery of the sensor module initially increases and then decreases starting from the side of the module bottom pointing outward in a direction which is normal relative to the module bottom.

8. The sensor module as recited in claim 1, wherein the sensor module is part of a system which also includes at least two sensor housings, and wherein the side of the module bottom pointing outward is adapted to an inside of a first sensor housing for installation, and the area of the module wall pointing in the opposite direction is adapted to an inside of a second sensor housing for installation.

9. The sensor module as recited in claim 8, wherein the at least two sensor housings each have an indentation on the inside, the side of the module bottom pointing outward being geometrically adapted to the indentation of the first sensor housing, and the area of the module wall pointing in the opposite direction being geometrically adapted to the indentation of the second sensor housing.

10. The sensor module as recited in claim 8, wherein the side walls of the sensor module have a first tilt on one side, with respect to a plane in which the connecting elements are situated, and a second tilt on the other side, with respect to a normal relative to the module bottom, and the side walls of the indentation of the first sensor housing have the first tilt and the side walls of the indentation of the second sensor housing have the second tilt.

* * * * *